United States Patent [19]

Zell et al.

[11] Patent Number: 5,311,399
[45] Date of Patent: May 10, 1994

[54] HIGH POWER CERAMIC MICROELECTRONIC PACKAGE

[75] Inventors: Felician A. Zell, Litchfield Park; Gerald R. Miller, Scottsdale, both of Ariz.

[73] Assignee: The Carborundum Company, Niagara Falls, N.Y.

[21] Appl. No.: 903,422

[22] Filed: Jun. 24, 1992

[51] Int. Cl.$^5$ .............................................. H05K 7/20
[52] U.S. Cl. .................................. 361/707; 257/669; 257/779; 361/767; 361/813
[58] Field of Search .................. 174/73.1; 228/180.2; 257/666, 669, 673, 674, 779, 781, 784, 735–736, 772; 361/386–389, 392, 394, 395, 403, 406, 421

[56] References Cited

U.S. PATENT DOCUMENTS

| | | | |
|---|---|---|---|
| 3,439,255 | 4/1969 | Carner et al. | 361/388 |
| 3,609,471 | 9/1971 | Scace | 317/234 |
| 3,716,759 | 2/1973 | Scace | 317/100 |
| 3,864,727 | 2/1975 | Schoberi | 357/65 |
| 4,042,952 | 8/1977 | Kraybill | 357/68 |
| 4,246,697 | 1/1981 | Smith | 29/827 |
| 4,436,785 | 3/1984 | Dietz | 428/427 |
| 4,437,228 | 3/1984 | Yamamoto | 29/590 |
| 4,480,013 | 10/1984 | Doi | 428/616 |
| 4,510,519 | 4/1985 | Dubois | 357/81 |
| 4,540,673 | 9/1985 | Takeda | 501/96 |
| 4,605,533 | 8/1986 | Kudoh | 428/622 |
| 4,761,345 | 8/1988 | Sato | 428/552 |
| 4,770,953 | 9/1988 | Horiguchi | 428/698 |
| 4,840,853 | 6/1989 | Iio | 428/698 |
| 4,873,151 | 10/1989 | Sato | 428/627 |
| 4,876,119 | 10/1989 | Takeda | 427/250 |
| 4,980,239 | 12/1990 | Harada | 428/552 |
| 5,063,121 | 11/1991 | Sato | 428/698 |

OTHER PUBLICATIONS

"Brazing of Aluminum Nitride Substrates", (M. G. Norton, J. M. Kajda, B. G. H. Steele)—Oct. 1990—pp. 2172-2176—*J. Mater. Res.*, vol. 5, No. 10.

"Wetting of Aluminum Nitride by Nickel Alloys", (M. Trontely, D. Kolar)—*Journal American Chemistry Society*, vol. 61, Nos. 5-6, May–Jun. 1978.

*Primary Examiner*—Gregory D. Thompson
*Attorney, Agent, or Firm*—Renner, Kenner, Greive, Bobak, Taylor & Weber

[57] ABSTRACT

A microelectronic package comprising a ceramic substrate (22) having a first surface bonded to a metal heat sink (25) and a second surface (30) opposite said first surface and having at least one metallized island (32) bonded to a lead frame (26), wherein the island has a uniform pullback (35) of metallization from the edge (36) of the substrate.

18 Claims, 5 Drawing Sheets

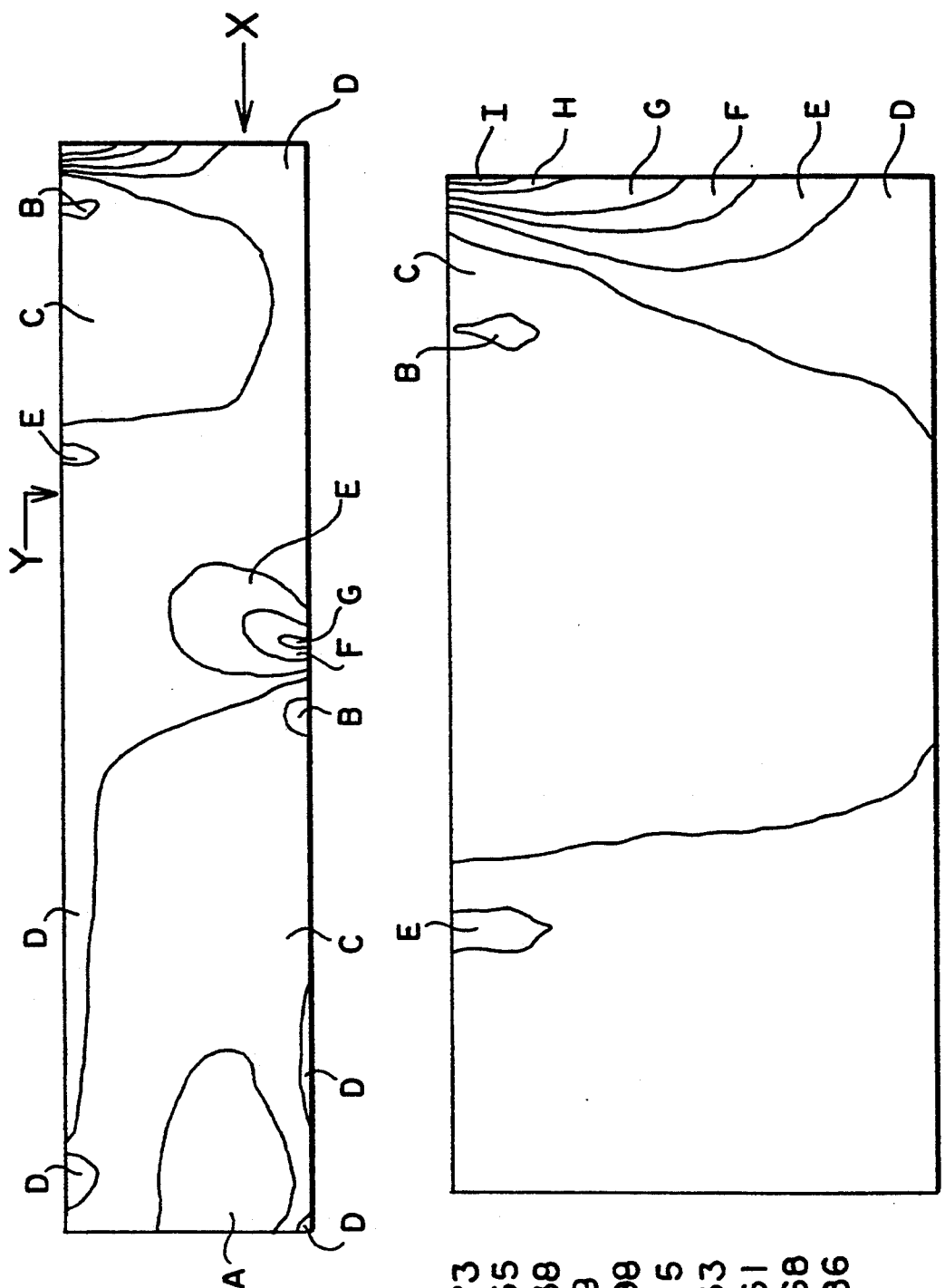

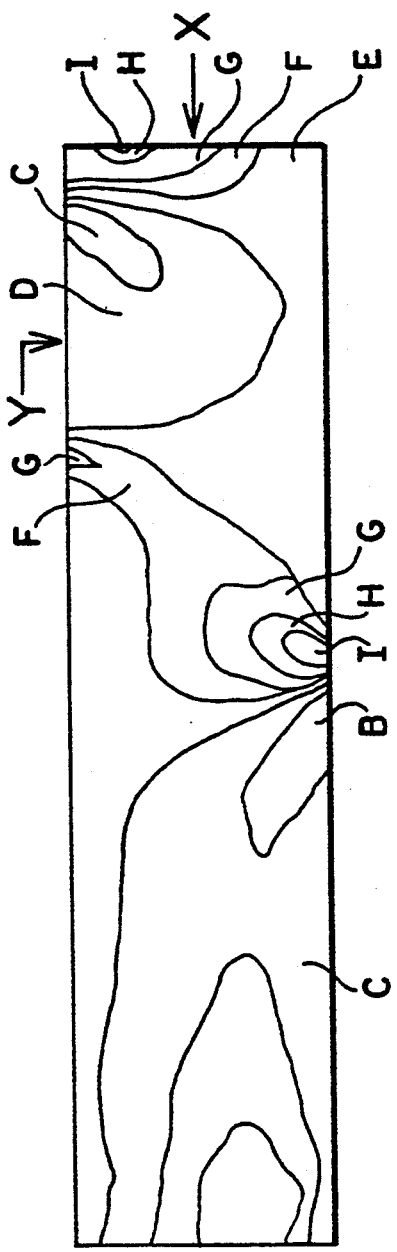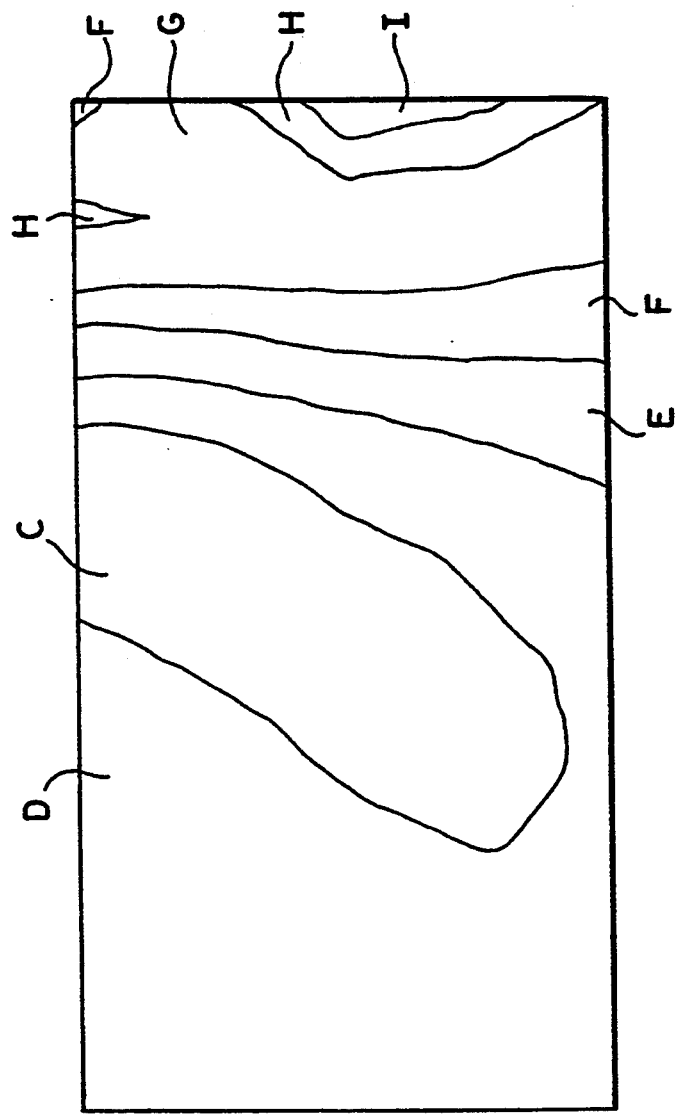
FIG. 7A
FIG. 7B
A -99.245
B -69.126
C -39.007
D -8.887
E 21.232
F 51.352
G 81.471
H 111.59
I 141.71
I 171.829

A  -99.221
B  -72.43
C  -45.639
D  -18.848
E  7.943
F  34.735
G  61.526
H  88.317
I  115.108
I  141.899

HIGH POWER CERAMIC MICROELECTRONIC PACKAGE

BACKGROUND OF THE INVENTION

The present invention relates to the use of advanced ceramic materials in the electronic packaging of high power discrete semiconductor devices. Particularly, the invention relates to the use in electronic packaging of aluminum nitride (AlN) substrates which have been processed with a specific pattern of metallization in order to minimize residual stresses present in the substrate due to the manufacturing process for the package, i.e. brazing procedures.

A semiconductor device is incorporated into a microelectronic package to provide functions to the package. Electrical interconnection is provided for the transfer of power and information-bearing signals between the device and the external environment. Mechanical support is provided for durability in further manufacturing, handling and the operating environment. The device is protected from outside contaminants such as moisture, dust, and chemical agents.

High power discrete semiconductor devices such as power transistors, radio frequency and microwave frequency amplifiers, power control switches and the like generate a significant amount of heat in operation, on the order of 10 to 100 watts, and thus require heat dissipation through their carriers, e.g. ceramic substrates, in order to prevent overheating and damage to the device, such as diminished performance or operational failure.

Heat conduction is required as part of the thermal management of the semiconductor device and also for heat experienced in assembly procedures such as die attachment, wire bonding, encapsulation, testing and the like. Heat dissipation is required to cool the devices during use.

To accomplish heat conduction and dissipation, package materials having a high thermal conductivity are employed. These package materials must be carefully selected and incorporated or designed, however, so that thermal cycling does not induce deleterious stresses due to incompatibility of the coefficients of thermal expansion of the various package materials and/or the semiconductor device. Further, the package materials must minimize any adverse effects upon the transmission of power and electrical signals between the semiconductor device and other electronic elements in the system. Characteristics that must be addressed include dielectric constant of the substrate, resistance of the interconnects, and the like.

In applications where high heat dissipation is required, greater than about 5 to 10 watts as is encountered with power discretes, beryllia (BeO) has been used as a substrate material in conjunction with a metal heat sink. The hazardous nature of beryllia makes it undesirable, however. Additionally, the coefficient of thermal expansion of beryllia is about twice that of silicon, making the semiconductor substrate interface subject to mechanical stresses due to thermal or power cycling.

It is therefore desirable to replace the beryllia substrate with an advanced ceramic, such as aluminum nitride, which does not have the hazardous characteristics of BeO and which has a coefficient of thermal expansion (CTE) closer to that of the silicon semiconductor device while meeting other required characteristics.

The replacement of BeO with AlN is complicated, however, due to two factors. While the CTE match between AlN and silicon is closer than that between BeO and silicon, the CTE mismatch between AlN and the metal heat sink is greater than that between BeO and the metal. Also, BeO has a higher thermal conductivity than AlN, making it desirable to decrease the thermal path length between the semiconductor device and the metal heat sink. By reducing the thickness of the AlN ceramic substrate relative to the thickness of the BeO, equivalent thermal performance can be achieved.

The stress between the AlN substrate and the metal heat sink is therefore increased. One way to reduce the stress between the AlN substrate and the metal heat sink is to reduce the area of contact between those package elements. This has limited applicability, however, as too drastic a reduction in area will result in the loss of sufficient heat conduction from the device through the substrate to the heat sink on the substrate's opposite surface.

It is therefore necessary, in order to maintain the structural and operational integrity of the discrete package, to accomodate the stress between the AlN substrate and the metal heat sink by reducing stresses throughout the remainder of the package.

An area in which it is critical to reduce stresses is the area in which the lead frame is bonded to the substrate, as this structure is often the first to fail in a stressed package.

Because of the potential failure of the lead frame to substrate bond, it has been proposed to anchor the lead frame 11 to the substrate 12 by extending the metallization and the solder or braze 13 over the edge of the substrate as depicted in FIG. 1. This results however in the formation of stress region 14 where failure of the bond or the ceramic can occur catastrophically.

SUMMARY OF THE INVENTION

It is therefore an object of the present invention to provide a discrete microelectronic package utilizing an aluminum nitride substrate which is equivalent in performance to beryllia oxide containing packages.

It is also an object of the present invention to provide a discrete microelectronic package design to accomodate residual stresses present in the package due to differences in the coefficients of thermal expansion of the various package elements, such as the aluminum nitride substrate and the metal heat sink, or the metal lead frame.

These and other objects of the invention set forth herein are accomplished by the present invention as hereinafter described and claimed.

The present invention provides a microelectronic package comprising a ceramic substrate having an edge, a first surface bonded to a metal heat sink and a second surface opposite said first surface and having at least one metallized island bonded to a lead frame, wherein said island has a uniform pullback of metallization from the edge of said substrate.

The present invention further provides a ceramic substrate having an edge and at least one metallized surface, said surface containing a metallized die attach area and at least one metallized island electrically isolated from the die attach area, said island having a uniform pullback of metallization from the edge of the substrate.

BRIEF DESCRIPTION OF THE DRAWINGS

FIG. 6A is a cross sectional elevation view of a substrate metallized with lead frame attachment according to FIG. 4, showing the magnitude of residual tensile stresses in the substrate.

FIG. 6B is an enlarged view of FIG. 6A between the axes X and Y.

FIG. 7A is a cross sectional elevation view of a substrate metallized with lead frame attachment according to FIG. 5, showing the magnitude of residual tensile stresses in the substrate.

FIG. 7B is an enlarged view of FIG. 7A between the axes X and Y.

DETAILED DESCRIPTION OF THE INVENTION

Figure 1:
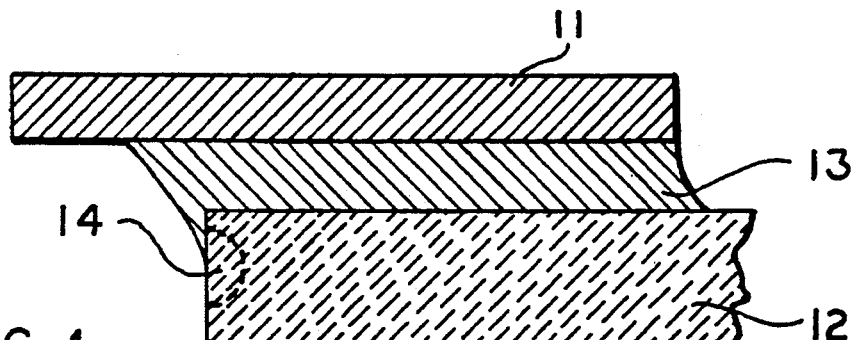
FIG. 1 is a cross sectional elevation view of a portion of a microelectronic package with a lead frame attachment not according to the present invention.
Figure 2:
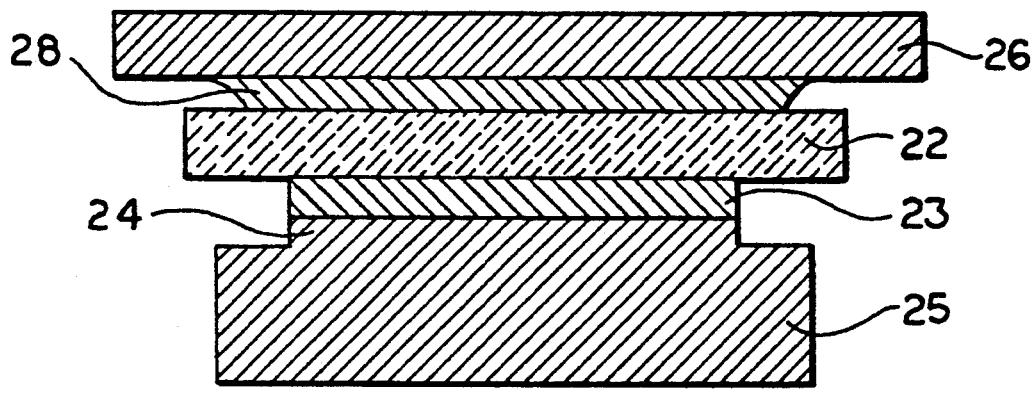
FIG. 2 is a cross sectional elevation view of a microelectronic package with a lead frame attachment according to the present invention.
Figure 3:
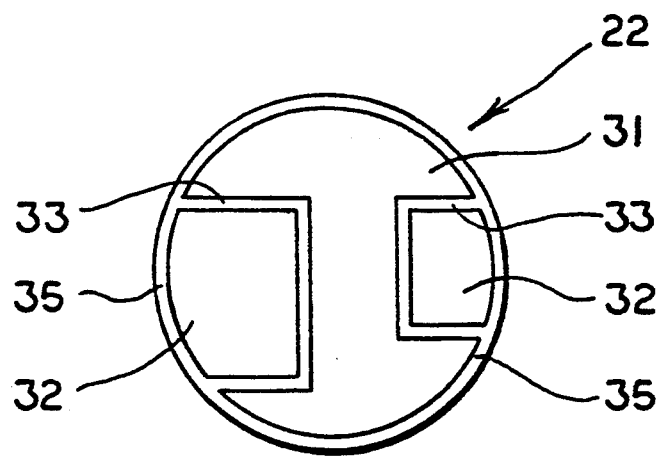
FIG. 3 is a plan view of a substrate exhibiting metallization pullback according to the present invention.

The present invention is directed to microelectronic packages capable of housing electronic devices to handle high thermal dissipation problems. In order to accomplish this, the microelectronic package 20 of the invention utilizes an advanced, thermally conducting ceramic substrate such as aluminum nitride 22 bonded by means of metallization/braze layer 23 on the substrate to neck 24 of metal heat sink 25 as shown in FIG. 2. Referring to FIGS. 2 and 3, on the surface of substrate 22 opposite heat sink 25 are die attach area 31 for mounting an electronic semiconductor device, islands 32 for bonding lead frame 26, and streets 33 for electrically isolating islands 32 from die attach area 31. Lead frame 26 will contain individual leads for carrying electrical signals, power and ground to and from the electronic device. While die attach area 31 and islands 32 are metallized on the surface of substrate 22 to provide for bonding by means of braze material 28, metallization is withheld from streets 33.

The use of aluminum nitride as ceramic substrate 22 permits a good match of its coefficient of thermal expansion (CTE) with that of the semiconductor material of the electronic semiconductor device, reducing temperature cycling induced stresses on the interfaces between these elements. While the CTE of the substrate and lead frame can be matched approximately, residual stresses in the ceramic substrate can cause failure in the area of substrate/lead frame interface.

Figure 4:
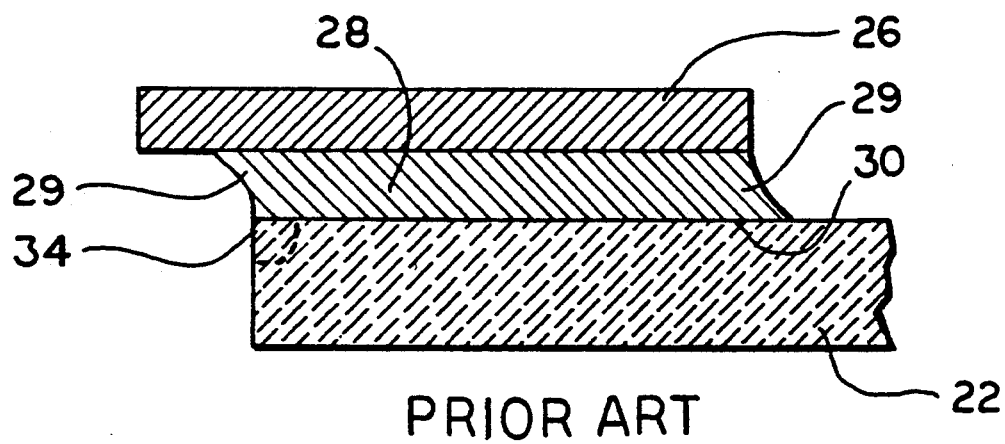
FIG. 4 is a cross sectional elevation view of a portion of a microelectronic package with a lead frame attachment not according to the present invention.
Figure 5:
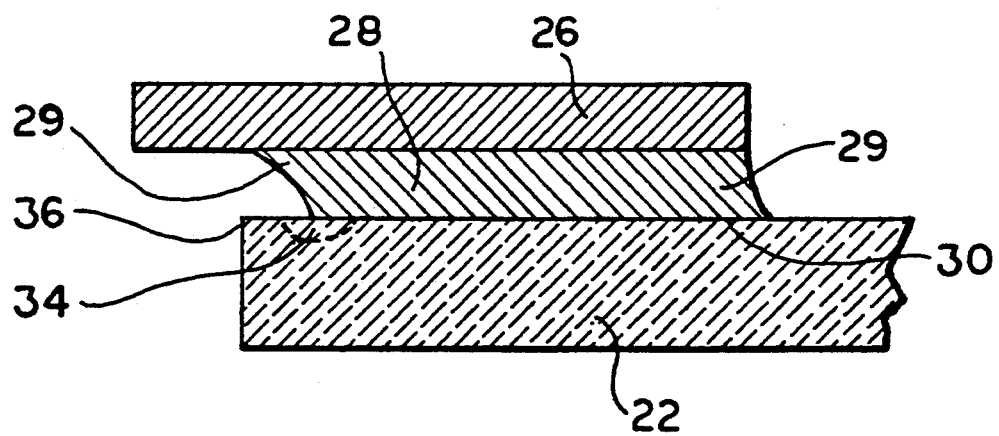
FIG. 5 is a cross sectional elevation view of a portion of a microelectronic package with a lead frame attachment according to the present invention.

In the past, substrate 22 would have been metallized to the edge of its perimeter on islands 32 and die attach area 31. Referring to FIGS. 4 and 5, when the braze material is heated to the braze temperature, braze material 28 wets metallized surface 30 of substrate 22 as well as lead frame 26, solidifying upon cooling to form fillets 29 from the edge of the wetted structures to the bonded structure.

We have found that it is in stress distribution area 34 of the substrate associated with the end point of the braze fillet 29 that the residual stresses are concentrated, and it is in this area that fracture has been observed. If the end point of the braze fillet (and consequently stress distribution area 34) is located at the edge of the ceramic substrate as depicted in FIG. 4, the stresses cannot be distributed over the bulk of the ceramic material, and fracture is more likely to occur.

We have found that the residual stress in the ceramic substrate can be minimized by the utilization of a metallization pullback 35 at the edge of substrate 22 (FIG. 3) which precludes fillet 29 formation at edge 36 of the substrate, this phenomenon being depicted in FIG. 5. That is, metallization is withheld from the perimeter area of the substrate surface surrounding its edge in a controlled manner. The braze material will not wet the ceramic, and thus metallization pullback 35 prevents fillet 29 formation in that critical edge area.

As a result, the residual stresses in the ceramic substrate, bonded to a metal heat sink on one surface and a lead frame on the opposite surface, are shifted from the juncture of the substrate edge and endpoint of the fillet, and are reduced overall to provide an acceptable microelectronic package.

Advanced ceramic parts can be purchased commercially, such as from the Carborundum Company, located in Niagara Falls, New York, and others, which have been made by the tape cast process, in which a "tape" of a slurry of the advanced ceramic is cast with controlled thickness, dried and blanks are cut and sintered. Tape cast technology for thin ceramic structures is described for alumina in "Casting Ceramic-Polymer Sheets" by D. J. Shanefield in *Materials Research Society Symposium Proceedings*, Vol. 40, 1985. The preparation of aluminum nitride substrates is described in "Development of a High Thermal Conductive AlN Ceramic Substrate Technology" by N. Iwase et al. in *The International Journal for Hybrid Microelectronics*, Vol. 7, No. 4, December 1984.

The commercially available sintered parts are metallized conventionally by screen printing with a thick film ink such as those containing gold, silver, platinum, palladium, copper, tungsten, molybdenum, or molybdenum/manganese, are leveled, dried, and fired at about 800°–1800° C., depending on the metal ink used.

Advanced ceramic parts of aluminum nitride for substrates or thermally conductive caps can also be made in desired configurations by powder pressing technology, in which the advanced ceramic powder and other additives are mixed in a slurry, spray dried, and pressed in a mold to form pressed parts which are heated and fired to form sintered parts. Screen printing metallization can be applied to commercially available pressed and extruded substrates also.

Other metallization procedures, such as additive plating or thin film deposition, can be utilized to prepare the microelectronic packages of the present invention. Sintered substrate parts, whether prepared by cast tape, extrusion or pressed powder technology, may be metallized by additive or subtractive processes. As an example of such a subtractive process, layers of chromium, copper, and chromium are metallized (such as by metal plating, sputtering, or chemical vapor deposition/evaporation) onto the substrate and photoresist is applied. The desired pattern is exposed onto the coated substrate through a mask, and the pattern is developed and baked. The unprotected areas of metallization are stripped sequentially (Cr, Cu, Cr) from the patterned substrate, and the etched substrate is rinsed. The developed photoresist is then stripped to leave the metallized substrate, which can then be subjected to the brazing operation. Other metallization combinations, such as Ti/W, Cu, Au; Ti/W, Ni, Au; and Ti/W, Ni, Cu are also suitable.

Additive processes are also suitable for substrate metallization, in which photoresist is applied and exposed in a pattern, developed and etched. The substrate is metallized through the patterned resist additively, such as by sputtering of Ti/W and/or evaporation or plating of Ni, Cu or Au. The remaining resist is thereafter stripped to leave the metallized substrate, which can then be subjected to the brazing operation.

A metallization system which can be utilized to prepare packages according to the invention includes i) a first layer deposited by chemical or physical vapor deposition having a general formula based on atomic percent of $X_xZ_{100-x}$ wherein X is at least one of Ti, Zr, Hf, or a rare earth element; Z is at least one of Mo, W, Cr, Nb, Ta; and $10<x<60$; and, ii) a second layer deposited by sputtering or the like, comprising at least one of Co, Ni, Cu, and Fe such as a NiCu alloy of 40-90 atomic percent copper.

Incidental metallization pullback may occur as a result of imprecise masking or screen printing procedures, but this would be localized and not sufficient to provide the stress reduction effect produced by the present invention. According to the present invention, the pullback should be controlled so as to maintain a uniform, metallization-free zone around the perimeter of the substrate, at least on islands 32 which will be bonded, or brazed to lead frame 26. The metallization pullback 35 should be on the order of about 5 mils to 10 mils, extending from edge 36 of substrate 22 on its lead frame bonding surface 30. By "uniform pullback" is meant that the metallization pullback length is within the range sufficient to reduce residual tensile stress in the substrate as compared to a substrate having no metallization pullback at the substrate surface bonded to the lead frame.

Advanced ceramic substrates used in accordance with the present invention can be metallized by other known techniques and are thereafter further processed to add lead frames and heat sinks. Conventional lead frames can be utilized according to the present invention, such as those made of copper, copper alloys such as Cu-Fe, Cu-Cr, Cu-Sn, Fe-Ni alloys, Fe-Ni-Co alloys, or clad versions of these alloys (such as copper-clad). It is preferable that the CTE of the lead frame be compatible with that of the ceramic substrate. Conventional heat sinks are acceptable, copper being widely used.

Lead frames and heat sinks can be bonded to the metallized substrate, as discussed above, by conventional braze materials such as Ag, Ni, Cu, and Au based brazes, including but not limited to, for example, Ag-27Cu, Ag-25Cu-5Sn, Ag-5Al, Au-20Ge, or Ni-5B. The braze utilized according to this invention should not however contain Ti, Zr or Hf, as these will permit the braze material to wet the ceramic in the pullback area.

Brazing is carried out at the temperature suitable for the braze material chosen, preferably in an Ar or $H_2$ atmosphere, or in mixtures of $H_2$ and $N_2$, followed by cooling to room temperature. When a metal heat sink is brazed onto an aluminum nitride substrate at elevated temperature and cooled down, there is a tendency for the AlN to bend, producing a convex curvature of the substrate relative to the heat sink. When the semiconductor die, such as a silicon chip, is bonded at elevated temperature onto the substrate on the surface opposite the heat sink, the AlN will initially tend to flatten out, but when cooled down the substrate will again curve, both flexing and stressing the silicon die. The microelectronic package design of the present invention, utilizing a controlled metallization pullback, reduces stresses in the package overall, particularly reducing stress in the area of lead frame bonding and die attach.

The electronic semiconductor device can be attached to the metallized die attach area on the substrate, or to the lead frame, by known methods, such as soldering, brazing, or the use of a thermally conductive adhesive such as epoxy or filled glass, and the like.

The residual axial tensile stresses present in the ceramic substrate were calculated at 25° C. by computer modelling for microelectronic packages having no metallization pullback at the lead frame/substrate bonding surface and varying metallization pullback, the results being discussed below.

EXAMPLE 1

For the microelectronic package structure shown in FIG. 4, having no metallization pullback at the lead frame/substrate bonding surface and in which a copper heat sink was bonded on the opposite surface of the substrate, the axial stresses present in an aluminum nitride substrate were calculated. The results are shown in FIGS. 6A and 6B and the accompanying chart. Quantities shown in the chart are the average axial stresses for each lettered region expressed in megapascal units.

The maximum stress present in the ceramic substrate bonded according to the prior art occurs at the edge of the ceramic substrate at the end point of the braze fillet bonding the lead frame. The residual stress in this region was calculated to be 323.886 MPa.

EXAMPLE 2

For the microelectronic package structure shown in FIG. 5, having a metallization pullback of 5 mils from the edge of the substrate at the lead frame/substrate bonding surface and in which a copper heat sink was bonded on the opposite surface of the substrate, the axial stresses present in an aluminum nitride substrate were calculated. The results are shown in FIGS. 7A and 7B and the accompanying chart. Quantities shown in the chart are the average axial stresses for each lettered region expressed in megapascal units.

The maximum stress present in the ceramic substrate bonded according to the present invention having a metallization pullback of 5 mils is shifted down the edge of the ceramic substrate to a point where there is no structure which may be debonded. The residual stress in this region, the maximum for the substrate, was calculated to be lowered to 171.829 MPa.

EXAMPLE 3

Figure 8A:
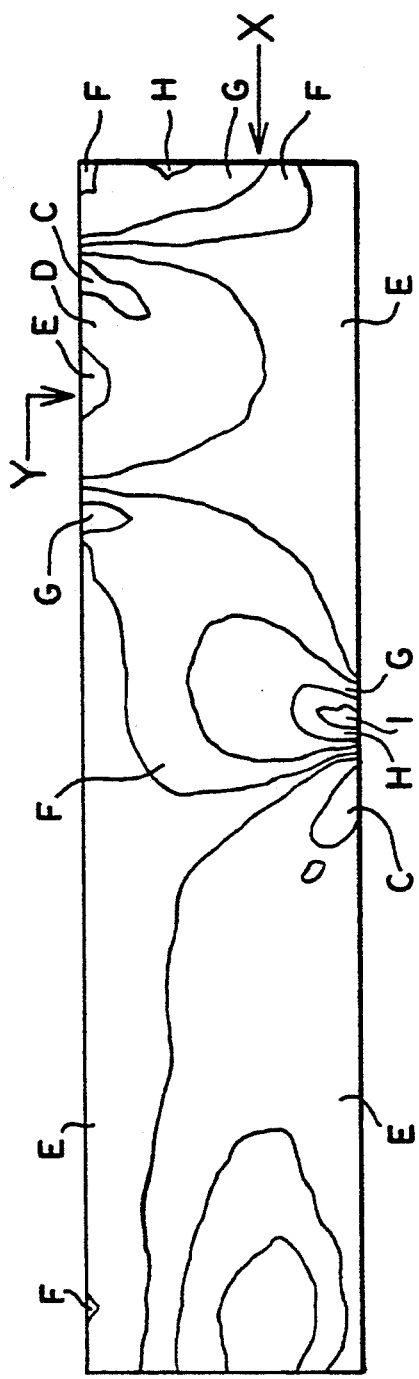
FIG. 8A is a cross sectional elevation view of a substrate metallized with lead frame attachment according to FIG. 5, showing the magnitude of residual tensile stresses in the substrate.
Figure 8B:
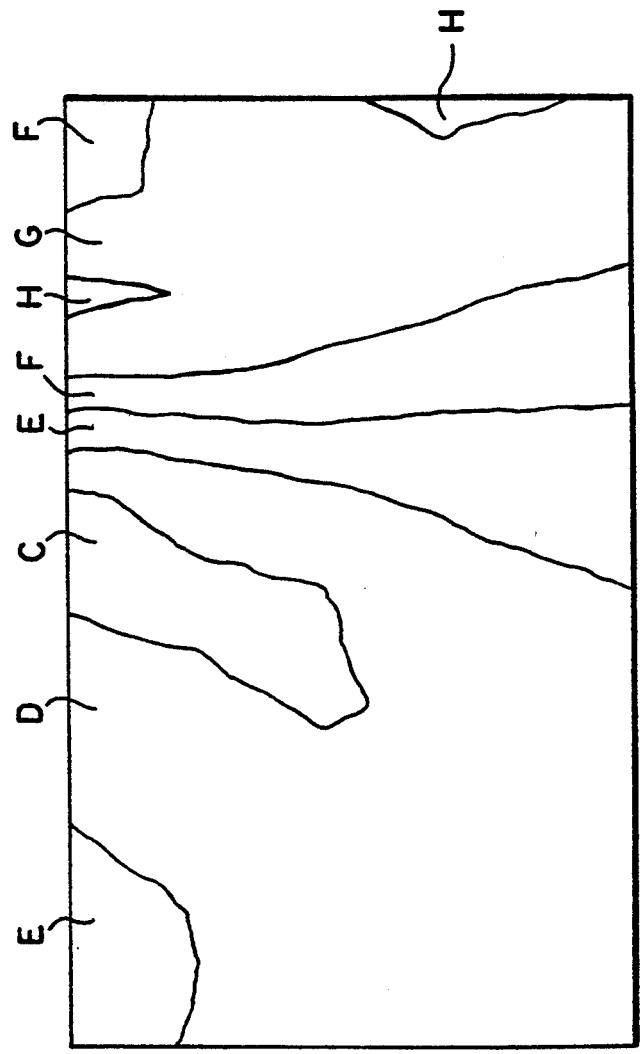
FIG. 8B is an enlarged view of FIG. 8A between the axes X and Y.

For the microelectronic package structure shown in FIG. 5, having a metallization pullback of 10 mils from the edge of the substrate at the lead frame/substrate bonding surface and in which a copper heat sink was bonded on the opposite surface of the substrate, the axial stresses present in an aluminum nitride substrate were calculated. The results are shown in FIGS. 8A and 8B and the accompanying chart. Quantities shown in the chart are the average axial stresses for each lettered region expressed in megapascal units.

The near maximum stress present in the ceramic substrate bonded according to the present invention having a metallization pullback of 10 mils is again shifted down the edge of the ceramic substrate to a point where there is no structure which may be debonded, and maximum stress is shifted to the area of the heat sink/substrate bonding surface, where a large bonding area secures the ceramic substrate to the heat sink. The residual stress in this region, the maximum for the substrate, was calculated to be lowered to 141.899 MPa.

In both examples 2 and 3 it is demonstrated that the overall stress in the substrate is lowered using the metallization pullback of the present invention. Further, the maximum residual stress is shifted away from the vulnerable lead frame/substrate bonding region.

We have therefore found that a controlled metallization pullback of 5 mils for an aluminum nitride substrate having brazed onto it a copper heat sink and a lead frame should result in the reduction of tensile stresses on the ceramic substrate of about 47%. A metallization pullback of 10 mils in the same structure should reduce the tensile stresses on the ceramic substrate by about 56%.

The actual effective range of metallization pullback is greater than 5-10 mils. However, at a pullback much less than 5 mils the precision of the masking and screen printing procedures are taxed. At a pullback much greater than 10 mils, particularly for small packages, the area of bonding contact between the package elements is reduced and also the stress in the ceramic at the edge of the heat sink joint is increased.

The present invention, featuring uniform metallization pullback on the lead frame bonding surface perimeter of the ceramic substrate, is therefore suitable for use with low frequency and radio frequency device microelectronic packages, such as three terminal devices containing ground, emitter and collector leads, e.g. an RF oscillator or amplifier. The invention is suitable for use with high power discrete devices, such as power transistors, radio frequency and microwave amplifiers, power control switches and the like.

Thus, the objects of the invention are accomplished by the present invention, which is not limited to the specific embodiments described above, but which includes variations, modifications and equivalent embodiments defined by the following claims.

What we claim is:

1. A microelectronic package comprising a ceramic substrate having an edge, a first surface bonded to a metal heat sink and a second surface opposite said first surface and having at least one metallized island bonded to a lead frame, wherein said island has a controlled length uniform pullback of metallization from the edge of said substrate, wherein the metallization pullback length is within the range sufficient to reduce residual tensile stress in said substrate compared to a substrate having no controlled length metallization pullback at the substrate surface bonded to a lead frame.

2. The microelectronic package of claim 1 further having a controlled length uniform pullback of metallization from substantially the entire outer perimeter of the second surface.

3. The microelectronic package of claim 1 wherein said substrate comprises aluminum nitride.

4. The microelectronic package of claim 1 wherein the metallization pullback is within the range of about 5 mils to about 10 mils.

5. The microelectronic package of claim 1 wherein at least one of said metal sink and said lead frame is bonded to said substrate by a braze material.

6. The microelectronic package of claim 5 wherein said braze material comprises at least one element selected from the group consisting of silver, nickel, copper, gold, mixtures thereof, and alloys thereof.

7. The microelectronic package of claim 6 wherein said braze material is substantially free from titanium, zirconium, and hafnium.

8. The microelectronic package of claim 1 further having a die attach area on said second surface electrically isolated from said island and a semiconductor device bonded to the die attach area.

9. The microelectronic package of claim 8 wherein the semiconductor device is an RF oscillator or amplifier.

10. The microelectronics package of claim 1 having at least one additional separate island bonded to a corresponding separate lead frame, wherein said at least one additional separate island has a controlled length uniform pullback of metallization from the edge of said substrate, wherein the metallization pullback length is within the range sufficient to reduce residual tensile stress in said substrate compared to a substrate having no controlled length metallization pullback at the substrate surface bonded to a lead frame.

11. The microelectronics package of claim 10 wherein said substrate comprises aluminum nitride.

12. The microelectronics package of claim 2 wherein said substrate comprises aluminum nitride.

13. A ceramic substrate having an edge and at least one metallized surface, said surface containing a metallized die attach area and at least one metallized island electrically isolated from the die attach area, said island having a controlled length uniform pullback of metallization from the edge of the substrate, wherein the metallization pullback length is within the range sufficient to reduce residual tensile stress in said substrate compared to a substrate having no controlled length metallization pullback at the substrate surface bonded to a lead frame.

14. The ceramic substrate of claim 13 having at least two metallized islands electrically isolated from the die attach area, said islands having a controlled length uniform pullback metallization from the edge of the substrate.

15. The ceramic substrate of claim 13 wherein the metallization pullback is within the range of about 5 mils to about 10 mils.

16. The ceramic substrate of claim 13 further having a controlled length uniform pullback of metallization from substantially the entire outer perimeter of said surface.

17. The ceramic substrate of claim 16 wherein the metallization pullback is within the range of about 5 mils to about 10 mils.

18. The ceramic substrate of claim 13 wherein the ceramic substrate comprises aluminum nitride.

* * * * *